United States Patent [19]

Setzer et al.

[11] Patent Number: 5,317,258
[45] Date of Patent: May 31, 1994

[54] DEVICE FOR EVALUATING PERIODIC SIGNALS FROM INDUCTIVE PICK-UPS HAVING A PULSE FORMER STAGE INFLUENCED AS A FUNCTION OF THE PICK-UP SIGNAL AMPLITUDE

[75] Inventors: Jürgen Setzer, Illingen; Hans Braun, Stuttgart; Hermann Stein, Kernen, all of Fed. Rep. of Germany

[73] Assignee: Daimler-Benz AG, Fed. Rep. of Germany

[21] Appl. No.: 948,087

[22] Filed: Sep. 21, 1992

[30] Foreign Application Priority Data

Sep. 19, 1991 [DE] Fed. Rep. of Germany ....... 4131128

[51] Int. Cl.[5] .................... G01N 27/72; G01B 7/14; G01P 3/48; G01P 3/54
[52] U.S. Cl. .............................. 324/225; 324/207.12; 324/168
[58] Field of Search ........... 324/166, 168, 173, 207.12, 324/225, 207.15

[56] References Cited

FOREIGN PATENT DOCUMENTS 0046006 2/1982 European Pat. Off. .
2235056 9/1975 Fed. Rep. of Germany .
2843981 4/1980 Fed. Rep. of Germany .
3433777 3/1986 Fed. Rep. of Germany .
3226073 7/1986 Fed. Rep. of Germany .
3708210 12/1988 Fed. Rep. of Germany .
3936831 5/1991 Fed. Rep. of Germany .

OTHER PUBLICATIONS

*Elektrotechnik* 66 (Mar. 1984), p. 61, "Drehzahlgeber mit de Magnetschranke HKZ 101" (no translation).

*Primary Examiner*—Walter E. Snow
*Attorney, Agent, or Firm*—Evenson, McKeown, Edwards & Lenahan

[57] ABSTRACT

A device for evaluating periodic signals from inductive pick-ups compensates for the lag of the pick-up signal. This lag increases with increasing frequency as a consequence of the inductance of the pick-up, with respect to the position of a movable part that is to be scanned by the said pick-up. The relative time shift in the evaluation edge of the pick-up signal, which is phase-compensated via the frequency, is compensated for via changes in the amplitude of the pick-up signal.

12 Claims, 3 Drawing Sheets

DEVICE FOR EVALUATING PERIODIC SIGNALS FROM INDUCTIVE PICK-UPS HAVING A PULSE FORMER STAGE INFLUENCED AS A FUNCTION OF THE PICK-UP SIGNAL AMPLITUDE

BACKGROUND AND SUMMARY OF THE INVENTION

The present invention proceeds from a device for evaluating periodic signals from inductive pick-ups which has a peak detector. The pick-up signal can be applied from the output of the inductive pick-up in order, as a function of the pick-up signal amplitude, to influence the transition from a first to a second logic state at the output of a downstream pulse former stage having two inputs. It is possible to feed the first input with a variable reference signal and the second input with the pick-up signal.

German Patent 2,235,056 discloses a circuit arrangement for an inductive pick-up. Variation in the external magnetic conditions due to parts that are moved past periodically induces an AC voltage in this pick-up. The circuit has a trigger circuit which then converts this AC voltage into a pulse train of the same frequency. For this purpose, the AC voltage is applied to the input of a peak detector which forms from the peak value a proportional direct voltage which is fed to the trigger circuit in order to influence its turn-on level such that the peak value of the AC voltage still just causes the trigger circuit to change state. A fundamental disadvantage of this circuit arrangement is that it does not eliminate the phase error which is caused by the frequency-dependent inductive reactive component of the internal impedance of the pick-up and is speed-dependent, which generally means frequency-dependent.

The printed publication "Motor-Elektronik", 1983 published by Robert Bosch GmbH, discloses a device for evaluating periodic signals from inductive pick-ups. An example of such a pick-up described there is a crankshaft angle pick-up which transmits a speed-analog AC voltage. In order to be able to process this AC voltage in an electronic control unit, the AC voltage is converted by means of a Schmitt trigger into square-wave current pulses; the fixed hysteresis of the Schmitt trigger simultaneously increases in this arrangement the insensitivity with respect to specific disturbances. Disturbances which reach beyond the hysteresis threshold of the Schmitt trigger lead, however, to missing pulses at the output of the Schmitt trigger.

German Offenlegungsschrift 3,433,777 describes an improvement in this regard in which a trigger threshold of the Schmitt trigger is shifted as a function of the signal of a peak detector. The result is an adaptive pulse shaping which depends on different pick-up amplitudes and is intended to offer an improved interference immunity. Furthermore, it is proposed in the case of a desirable phase-accurate detection of the pick-up signal permanently to set a trigger threshold of the Schmitt trigger, in particular at the zero crossing of the pickup voltage.

A disadvantage of this known device is that it does not eliminate the frequency-dependent phase error mentioned above. In this device, a "phase-accurate detection" is possible respectively at a specific speed of a rotation element to be monitored or at a fixed frequency of the pick-up signal only to the extent that this is taken to mean an unambiguous coordination between the instantaneous voltage and position of the rotation element whose rotary position is to be scanned.

It is an object of the invention to provide a device for evaluating periodic signals from inductive pick-ups which have a substantially reduced phase error in the overall nominal frequency range of periodic input signals.

This and other objects are achieved by the present invention which provides a device for evaluating periodic signals from inductive pick-ups. This device has a peak detector to which a pick-up signal can be applied from an output of the inductive pick-up in order to influence, as a function of the pick-up signal amplitude, a transition from a first to a second logic state at an output of a downstream pulse former stage having first and second inputs. The first input is provideable with a variable reference signal and the second input with the pick-up signal. A pulse generator stage receives the pick-up signal as an input and generates at an output pulses at a repetition frequency which corresponds to the frequency of the pick-up signal. A weighting stage combines the signals from the output of the peak detector and from the output of the pulse generator to form a variable reference signal in a predetermined fashion.

An important advantage of the device according to the present invention is that the lagging of the periodic signal of an inductive pick-up in the case of increasing frequency, for example in the case of increasing speed of a part that is to be continuously scanned, is compensated for. As a result, for example, the absolute reference error between the actual position of the part to be scanned and the instantaneous value, characterizing this position, of the pick-up signal is reduced. An integral part of this process, which further increases the reference accuracy, is an exertion of influence, on a signal edge provided for further processing, as a function of the amplitude of the pick-up signal.

Other objects, advantages and novel features of the present invention will become apparent from the following detailed description of the invention when considered in conjunction with the accompanying drawings.

DETAILED DESCRIPTION OF THE DRAWINGS

Figure 1A:
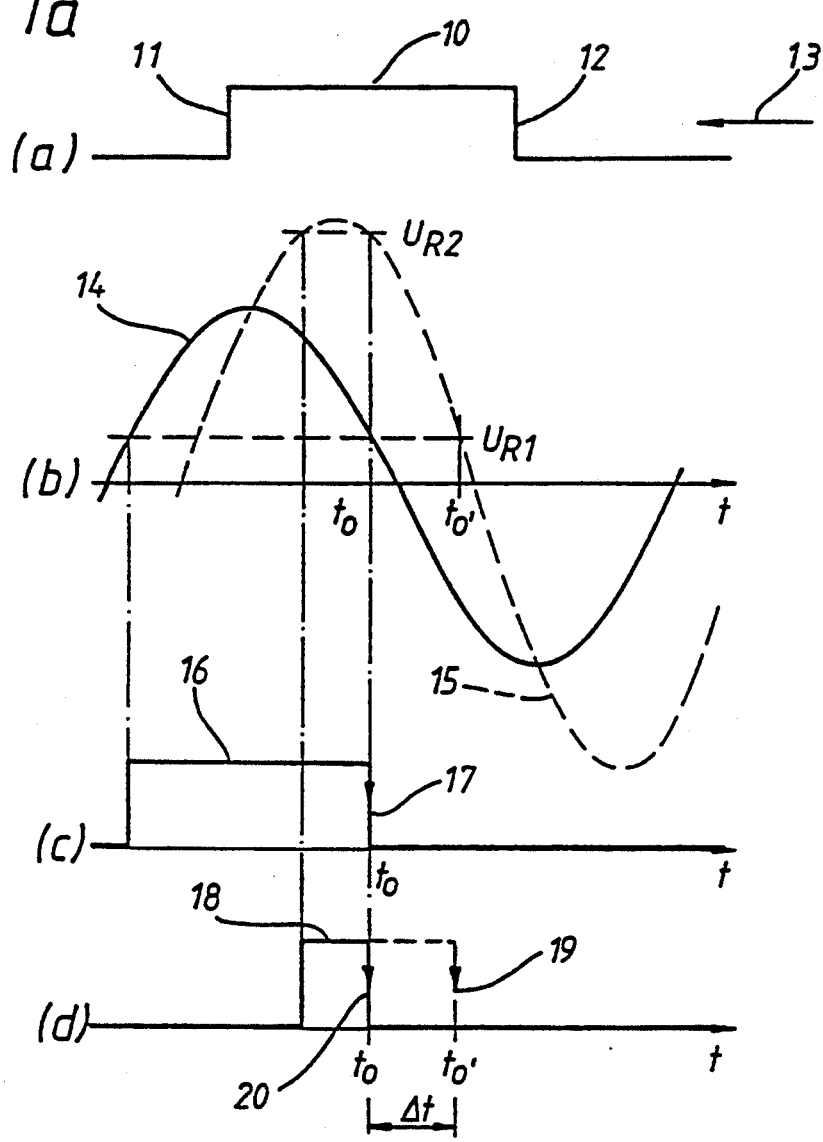
FIG. 1a shows a time-normalized, diagrammatic illustration of the shift of a triggering instant derived from an inductive pick-up signal.

A tooth 10, Which can move in the direction of the arrow 13 for example, of an inductive pick-up is illustrated in row (a) of FIG. 1a. By virtue of tooth flanks 11 and 12 which vary the magnetic flux, the tooth 10 produces in the winding of the pick-up a signal voltage whose frequency is determined by the frequency of corresponding magnetic field variations and whose amplitude is determined by the inductance of the pickup and by the measure of the change in the magnetic flux density to which the inductance is exposed.

Two such signal voltages 14 and 15 are represented in row (b) time-normalized over time for different frequencies. It may be seen that the higher signal voltage 15, which is assigned to a higher frequency, temporally lags behind the lower signal voltage 14, which is assigned to a lower frequency. A trigger circuit which is fed by corresponding voltages and transmits a signal 16 with the logic state L in accordance with row (c), for example as a function of the exceeding on the input side of a reference level $U_{R1}$, thus generates at the instant $t_0$ a falling edge 17 which can be further processed and is to be assigned a specific instantaneous position of a movable part (which is connected to the pick-up tooth).

Figure 1B:
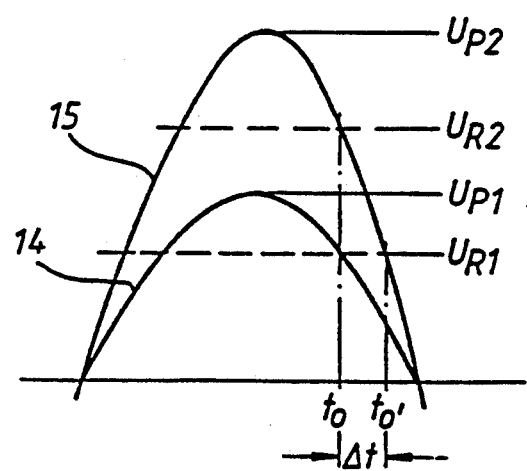
FIG. 1b shows a diagrammatic illustration of the amplitude-dependent shift of a triggering edge derivable from a periodic pick-up signal.

If this movable part moves quicker, the above-mentioned time shift in the signal voltage 15 with respect to the signal voltage 14 is enough in itself to produce a delayed falling edge 19, normalized by $\Delta t$ at the instant $t_0$, in a correspondingly conditioned position signal 18. FIG. 1b illustrates, however, that even without a change in the movement of this part a change in the alternating conditions of magnetic flux, for example as a consequence of a fluctuating air-width between the pick-up tooth and the inductive part of the pick-up, is sufficient to cause a correspondingly normalized time shift $\Delta t$. If the signal voltage reaches the peak voltage $U_{P2}$, the threshold voltage $U_{R1}$ which triggers a corresponding falling edge reaches $t_0$, at an instant that is delayed with respect to the instant to by $\Delta t$. Such a delay can be avoided by raising the threshold voltage $U_{R1}$ to the higher value $U_{R2}$. It may thus be gathered from row (d) of FIG. 1a, that raising a lower threshold voltage $U_{R1}$ to a higher threshold voltage $U_{R2}$, something which is evidently to be undertaken as a function of frequency and signal amplitude, can lead to an identical temporal position of the falling signal edges 17 and 20.

Figure 2:
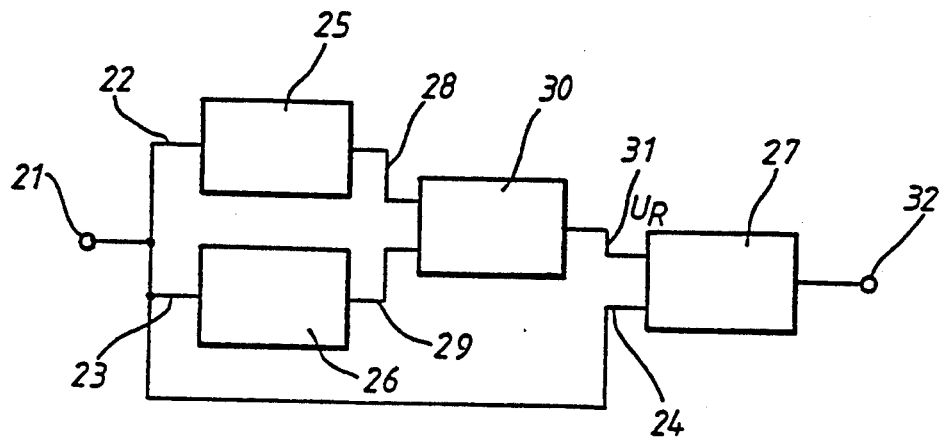
FIG. 2 shows a block diagram of the device constructed according to an embodiment of the invention.

This function is performed by the device in accordance with FIG. 2. The pick-up signal passes from an input terminal 21 to the input 22 of a peak detector 25, to the input of a pulse generator 26 and to the second input 24 of a comparator 27. The outputs 28 and 29 of the peak detector 25 and of the pulse generator 26 feed a weighting stage 30 whose output is connected to the first input 31 of the comparator 27. The output of the comparator 27 is led to the output terminal 32, at which the phase-compensated pick-up signal can be tapped. The comparator 27 acts as a pulse former.

The device functions as follows. The peak detector 25 transmits an output voltage which corresponds to the instantaneous peak value of the input signal present at the terminal 21. The pulse generator 26 is triggered synchronously with the pick-up signal and delivers at its output a continuous pulse having, for example, a constant pulse duration, but having a pulse pause duration that decreases with increasing pick-up signal frequency, that is to say having a correspondingly increasing pulse duty factor. The pulse duration must therefore be selected to be so short that the pulse duty factor remains less than 1 even for the highest frequency of the pick-up signal occurring in practice.

The corresponding pulse is integrated in the weighting stage 30, which can be realized as a multiplier, for example, and is weighted with the output signal of the peak detector 25. The necessary threshold voltage $U_R$, which "slides" over the frequency and amplitude of the pick-up signal and serves the comparator 27 as reference voltage for the comparison with the instantaneous value of the signal voltage of the pick-up, is output at the output 31. In this way, the pulse transmitted at the output terminal 32 is compensated for in the sense of FIG. 1l, row (d), given an increase in the frequency and/or the voltage of the pick-up signal, so that a falling edge of the signal which is not temporally dependent on the absolute magnitude of the pickup signal and its frequency is achieved at the output terminal 32.

The pulse generation and Weighting can, however, be performed equally well as part of an integrated function, as explained further below by way of example.

Figure 3:
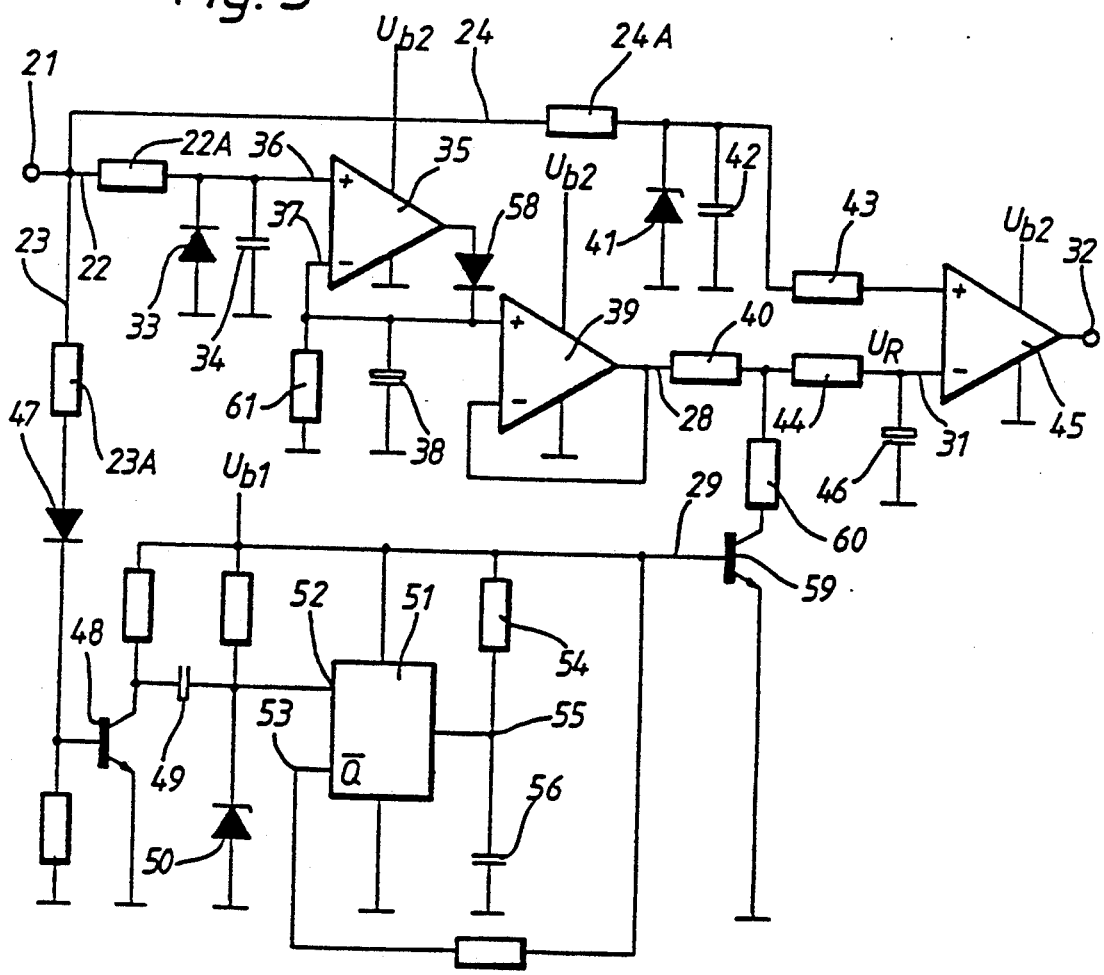
FIG. 3 shows a circuit diagram of a first exemplary embodiment of the present invention.

FIG. 3 illustrates with the aid of a circuit diagram the practical realization and function of a first exemplary embodiment of the invention in accordance with FIG. 2.

The pick-up signal is provided from the terminal 21 to a diode 33 via a first decoupling resistor 22A. A capacitor 34 is connected in parallel to the diode 33 in order to filter out high-frequency spurious peaks. The pick-up signal thus cleaned is provided to the positive input of an amplifier 35, from the low-resistance output of which the signal peak value is transmitted via a diode 58 to a storage capacitor 38. A resistor 61 connected in parallel to the capacitor 38 ensures a certain level of steady discharge of the capacitor 38, so that the capacitor voltage can follow changes in the pick-up signal at the input 21.

The voltage across the capacitor 38, which replicates the amplitude of the pick-up signal, is present on an even lower internal impedance at the output 28 of the amplifier 39 which is connected as an impedance transformer. This voltage is transmitted via the resistors 40 and 44 to the smoothing capacitor 46, which consequently realizes a low-pass or integration function.

The pick-up signal is provided from the terminal 21 via a second decoupling resistor 23A via a diode 47 to the base of a transistor 48, which in conjunction with a capacitor 49 and a DC clamp diode 50 functions as the drive circuit of a pulse generator 51. The pulse generator 51 can be, for example, a monostable multivibrator whose timing input 55 is connected here, for example, to a charging resistor 54 which determines the pulse duration, and a capacitor 56.

The output 53 (inverted in FIG. 3 by way of example) of the pulse generator 51 acts here on a switching transistor 59. The state of the collector of the transistor 59 corresponds consequently to the state of output 29 of the pulse generator 26 in FIG. 2. From the output of the amplifier 39, the collector of the transistor 59 is fed via a resistor 60 with a "supply voltage" which floats in accordance with the pick-up signal amplitude.

Consequently, the resistors 40, 44, the transistor 59 and the capacitance of the smoothing capacitor 46 represent the weighting stage 30 of FIG. 2. The smoothing capacitor 46 is connected to the first input of a comparator 45, which is thus fed the reference voltage $U_R$ present across this smoothing capacitor 46.

The pick-up signal is provided via a third decoupling resistor 24A from the terminal 21 via a resistor 43 to the second input of the comparator 45, protected here as for example by a DC clamp diode 41, an anti-interference capacitor 42 and the further series resistor 43. The output of the comparator 45 feeds the output terminal 32.

The function of the device according to the circuit diagram corresponds to that previously described in conjunction with FIG. 2, the weighting being achieved as follows. With increasing frequency of the pick-up signal present at the terminal 21, the pulse duty factor at the collector of the transistor 59 becomes smaller. This leads to an increase in the average time which results from the recurring time intervals and during which the transistor 59 is non-conductive and is consequently (at least partially) unable to divert to ground the current flowing from the output of the amplifier 39 in the direction of the capacitor 46. As a result, the smoothing capacitor 46 charges up to a correspondingly higher potential, with the consequence that the reference voltage Us at the second input of the comparator 45 is increased and temporally advanced owing to the falling signal edge at the output of the comparator 45.

On the other hand, an increase in the pick-up signal voltage causes a correspondingly similarly directed increase in the output voltage of the amplifier 39, which output voltage acts as source voltage for the transistor 59 and the capacitor 46, so that the reference voltage of the comparator 45 follows the amplitude of the pick-up signal in a corresponding way.

This enables the phase of the periodic signal of an inductive pick-up to be compensated for with a very high accuracy with respect to changes in frequency and amplitude.

Figure 4:
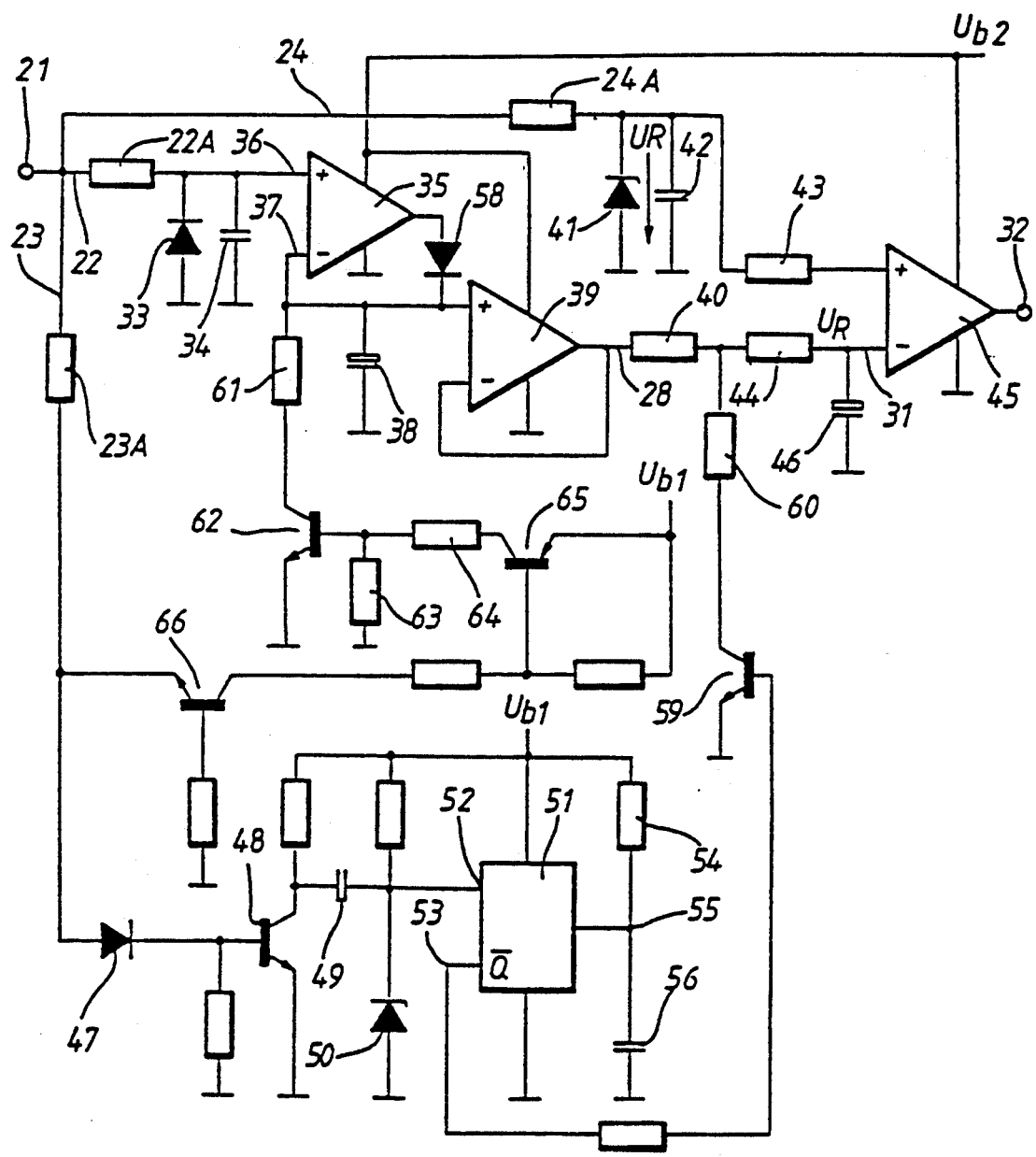
FIG. 4 shows the circuit diagram of a second exemplary embodiment of the present invention.

In the exemplary embodiment in accordance with FIG. 4, the continuous discharge of the storage capacitor 38 is replaced by a discharge occurring at intervals of time and synchronously with the pick-up signals. For this purpose, the circuit in accordance with FIG. 3 is expanded by a discharge circuit 62 to 66 controlled by the pick-up signal.

The emitter input of a transistor 66 that is operated in a common-base circuit, is connected between the resistor 23A and the diode 47. Its load resistor on the collector side acts on the base of a complementary transistor 65, whose load resistor 64 on the collector side forms in conjunction with a leakage resistor 63 a voltage divider to the tap of which the base of a switching transistor 62 is connected. The resistor 61 already mentioned is connected to the collector of the transistor 62, while the emitter of the transistor 62 is connected to ground.

The functioning of this circuit is as follows. The resistor 61 can be connected to ground depending on the drive of the transistor 62, that is to say in the event of a drive occurring in time intervals this connection is made correspondingly in time intervals. The peak value of the pick-up signal remains stored in the capacitor 38 until the pick-up signal reaches or exceeds a limiting potential of here, for example, approximately $-0.7$ V. The transistor 66 is turned on during all the time intervals in which the pick-up signal is equal to this potential or falls below this potention. The collector current of the transistor 66 turns on the transistors 65 and 62, so that the resistance of the switching path of the transistor 62 becomes low and the capacitor 38 is consequently at least partially discharged via the discharge resistor 61 (and the low saturation resistance of the switching path of the transistor 62).

The result of this expansion is that the capacitor 38 can be discharged in a defined way or can be charged from a respectively defined discharged state, resulting in a shorter response time and an improved transient response of the device in the event of rapid changes in the pick-up signal.

It is not beyond the scope of the invention if, for example, the function of the pulse generator 26 and that of the weighting stage 30 are realized by being integrated into a special circuit. An example would be, for example, a pulse generator whose pulse can be triggered by the pick-up signal and whose pulse length can be controlled in accordance with a signal output by the peak detector (pulse-width modulation). The modulation input of such a circuit would then be fed analogously by the resistor 40, while the low-pass element consisting of the resistor 44 and the smoothing capacitor 46 would then be supplied exclusively by the output of such a circuit.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. Device for evaluating periodic signals from inductive pick-ups, comprising:
   a peak detector having an output, and an input to which a pick-up signal can be applied from an output of the inductive pick-up in order to influence, as a function of the pick-up signal amplitude, a transition from a first to a second logic state at an output of a downstream pulse former stage having first and second inputs, where the first input is provideable with variable reference signals and the second input with the pick-up signal;
   a pulse generator stage which receives the pick-up signal as an input and generates at an output pulses at a repetition frequency which corresponds to the frequency of the pick-up signal; and
   a weighting stage having an output coupled to the pulse former stage, a first input coupled to the output of the peak detector, and a second input coupled to the output of the pulse generator stage, the weighting stage combining the signals from the output of the peak detector and from the output of the pulse generator stage to form said variable reference signal in a predetermined fashion.

2. Device according to claim 1, wherein the pulse former stage is a comparator stage.

3. Device according to claim 1 wherein the pulse generator stage includes at least one monostable multivibrator.

4. Device according to claim 3, wherein the pulses have a constant duration.

5. Device according to claim 1, wherein the weighting stage comprises at least one multiplier.

6. Device according to claim 1, wherein the weighting stage comprises at least a smoothing capacitor, a charging resistor and a switchable current source, the current source diverting at least a portion of a charging current provided for charging said smoothing capacitor during fixed time intervals formed by said pulses.

7. Device according to claim 6, further comprising an amplifier having an input and an output whose potential can be influenced in accordance with the output signal of the peak detector, said amplifier output providing said charging current, wherein the amplifier is coupled between the output of the peak detector and the first input of the weighting stage.

8. Device according to claim 1, wherein the pulse generator stage and the weighting stage are monolithically integrated, for at least part of their function, on a semiconductor chip.

9. Device according to claim 8, wherein the functionally integrated pulse generator stage and the weighting stage comprise a pulse generator, which can be triggered by the pick-up signal and which has a pulse duration that can be controlled as appropriate by the output signal of the peak detector.

10. Device according to claim 9, wherein the functionally integrated pulse generator stage comprises a pulse modulator having an output coupled to a low-pass function arrangement that has a response output coupled to the first input of the pulse former stage.

11. Device according to claim 1, wherein the peak detector comprises a storage capacitor for the peak value of the pick-up signal, and wherein discharging means are provided which, for the purpose of at least a partial discharge, shunt said storage capacitor as a function of an instantaneous value of the pick-up signal by means of a defined load resistor during time phases in which the pick-up signal falls below a prescribed limiting potential.

12. Device according to claim 11, wherein the limiting potential is $-0.7$ V.

* * * * *